United States Patent
Xu et al.

(10) Patent No.: US 10,476,021 B2
(45) Date of Patent: Nov. 12, 2019

(54) LIGHT EMITTING DIODE, ARRAY SUBSTRATE, LIGHT EMITTING DEVICE AND DISPLAY DEVICE

(71) Applicant: BOE TECHNOLOGY GROUP CO., LTD., Beijing (CN)

(72) Inventors: Wei Xu, Beijing (CN); Xin Gu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/772,504

(22) PCT Filed: Sep. 29, 2017

(86) PCT No.: PCT/CN2017/104562
§ 371 (c)(1),
(2) Date: Apr. 30, 2018

(87) PCT Pub. No.: WO2018/161552
PCT Pub. Date: Sep. 13, 2018

(65) Prior Publication Data
US 2019/0081260 A1  Mar. 14, 2019

(51) Int. Cl.
*H01L 29/08* (2006.01)
*H01L 51/50* (2006.01)
(Continued)

(52) U.S. Cl.
CPC .......... *H01L 51/502* (2013.01); *H01L 27/124* (2013.01); *H01L 27/3244* (2013.01);
(Continued)

(58) Field of Classification Search
None
See application file for complete search history.

(56) References Cited

U.S. PATENT DOCUMENTS 9,030,123 B2 * 5/2015 Choi ................. H05B 33/0896
313/504
2014/0042401 A1 2/2014 Kim et al.
(Continued)

FOREIGN PATENT DOCUMENTS

| CN | 103094430 A | 5/2013 |
| CN | 103579293 A | 2/2014 |

(Continued)

OTHER PUBLICATIONS

International Search Report and Written Opinion issued in International Application No. PCT/CN2017/104562 dated Dec. 27, 2017 (with English translation).

*Primary Examiner* — Hung K Vu
(74) *Attorney, Agent, or Firm* — McDermott Will & Emery LLP

(57) ABSTRACT

Embodiments of the present disclosure provide a light emitting diode, an array substrate, a light emitting device and a display device. The light emitting diode includes an anode, a hole transport layer, a light emitting layer, an electron transport layer, and a cathode sequentially disposed. The light emitting diode further includes a first auxiliary electrode and a first insulating layer which are disposed on a side of the anode away from the hole transport layer, wherein the first insulating layer is located between the first auxiliary electrode and the anode; and/or a second insulating layer and a second auxiliary electrode which are disposed on a side of the cathode away from the electron transport layer, wherein the second insulating layer is located between the second auxiliary electrode and the cathode.

17 Claims, 5 Drawing Sheets

(51) Int. Cl.
*H01L 27/32* (2006.01)
*H01L 51/52* (2006.01)
*H01L 27/12* (2006.01)

(52) U.S. Cl.
CPC ...... *H01L 51/5056* (2013.01); *H01L 51/5072* (2013.01); *H01L 51/5092* (2013.01); *H01L 51/5212* (2013.01); *H01L 51/5228* (2013.01); *H01L 27/1214* (2013.01)

(56) References Cited

U.S. PATENT DOCUMENTS

| | | | |
|---|---|---|---|
| 2015/0243716 A1* | 8/2015 | Kwon | H01L 51/5228 257/40 |
| 2016/0240757 A1 | 8/2016 | Daikoku et al. | |
| 2016/0322685 A1* | 11/2016 | Choi | H01M 2/1077 |

FOREIGN PATENT DOCUMENTS

| | | |
|---|---|---|
| CN | 205217755 U | 5/2016 |
| CN | 106920827 A | 7/2017 |

* cited by examiner

LIGHT EMITTING DIODE, ARRAY SUBSTRATE, LIGHT EMITTING DEVICE AND DISPLAY DEVICE

This application is the U.S. National Phase under 35 U.S.C. § 371 of International Patent Application No. PCT/CN2017/104562, filed on Sep. 29, 2017, which in turn claims priority to Chinese Patent Application No. 201710135932.0 filed on Mar. 8, 2017, titled "A LIGHT EMITTING DIODE, ARRAY SUBSTRATE, LIGHT EMITTING DEVICE AND DISPLAY DEVICE", the entire disclosures of which Applications are incorporated by reference herein.

TECHNICAL FIELD

The present disclosure relates to a field of electroluminescence technology, and more particularly, to a light emitting diode, an array substrate, a light emitting device and a display device.

BACKGROUND

A light emitting diode is a device directly excited by a current to emit light. At present, light emitting diodes include a Quantum dot light-emitting diode (QLED) and an Organic Light-Emitting Diode (OLED).

FIG. 1 is a structural diagram of a conventional light emitting diode. As shown in FIG. 1, the light emitting diode includes an anode 10, a hole transport layer 20, a light emitting layer 30, an electron transport layer 40 and a cathode 50 which are sequentially disposed. A principle of light emission of the light emitting diode is: under an action of an electric field, holes are injected from the anode 10 into a valence band of the light emitting layer 30 and migrate toward the cathode 50, and electrons are injected from the cathode 50 into a conduction band of the light emitting layer 30 and migrate toward the anode 10. In a case in which the holes and the electrons are injected into an energy level of the valence band and an energy level of the conduction band of the light-emitting layer 30 respectively, an exciton (electron-hole pair) is formed under the Coulomb force, an electron in an exciton state undergoes a radiation transition, and energy is released in a photon form, thereby an electroluminescence is achieved.

However, when the light emitting diode is a QLED, a material of the light emitting layer 30 is a quantum dot light emitting material. Exemplarily, if a HOMO (highest occupied molecular orbital) energy level of a material of the hole transport layer 20 is 5.0~6.0 eV, and the energy level of the valence band of the quantum dot is 6.0~7.0 eV, there is a large hole injection barrier at the interface between the hole transport layer 20 and a quantum dot light emitting layer 30. Since the energy level of the conduction band of a material of the electron transport layer 40 such as ZnO nanoparticles is close to the energy level of the conduction band of the quantum dot, there is a problem that electrons injection and holes injection are unbalanced. A luminous intensity is proportional to the product of electrons concentration and holes concentration. In a case in which the electrons concentration and the holes concentration are same, the luminous intensity is maximum. In a case in which a difference between the electrons concentration and the holes concentration is larger, the luminous intensity is smaller, and excess carriers will cause Joule heating, thereby a lifetime of the device is shortened.

In a case in which the light emitting diode is an OLED, the material of the light emitting layer 30 is an organic electroluminescent material, and an injection capability of a carrier is proportional to a mobility of a material and a square of a voltage applied to the carrier, and the injection capability of the carrier is inversely proportional to a thicknesses of the electron transport layer 40 or to a thicknesses of the hole transmission layer 20. In an organic electroluminescent diode, the thicknesses of the electron transport layer 40 and the thickness of the hole transport layer 20 are both approximately several tens of nanometers, and are of the same order of magnitude. Furthermore, in the organic electroluminescent diode, when a voltage is applied to the anode 10 and the cathode 50, it may be approximately assumed that an electric field intensity falls uniformly on the electron transport layer 40 and the hole transport layer 20. However, if the mobility of the material of the electron transport layer 40 is lower than the mobility of the material of the hole transport layer 20, it will lead to an imbalance between an injection of the electrons and an injection of the holes, thereby affecting the luminous efficiency and the lifetime of the organic light-emitting diode.

SUMMARY

Embodiments of the present disclosure adopt the following technical solutions. A first aspect of the present disclosure provides a light emitting diode. The light emitting diode includes an anode, a hole transport layer, a light emitting layer, an electron transport layer and a cathode sequentially disposed. The light emitting diode further includes a first auxiliary electrode and a first insulating layer which are disposed on a side of the anode away from the hole transport layer, wherein the first insulating layer is located between the first auxiliary electrode and the anode; and/or the light emitting diode further includes a second insulating layer and a second auxiliary electrode which are disposed on a side of the cathode away from the electron transport layer, wherein the second insulating layer is located between the second auxiliary electrode and the cathode.

Optionally, the anode and/or the cathode have/has a mesh structure or a porous structure.

Optionally, the light emitting diode further includes a hole injection layer disposed between the anode and the hole transport layer, and/or an electron injection layer disposed between the cathode and the electron transport layer.

Further optionally, in a case in which the light emitting diode further includes the hole injection layer and the electron injection layer, each of thicknesses of the hole transport layer, the hole injection layer, the electron injection layer and the electron transport layer ranges from 1 nm to 200 nm.

Optionally, a material of the light emitting layer includes a quantum dot light emitting material or an organic electroluminescent material.

A second aspect of the present disclosure provides an array substrate. The array substrate includes a plurality of light emitting diodes described above arranged in a matrix.

Optionally, the array substrate further includes a thin film transistor. The thin film transistor includes a source, an active layer, a drain, a gate and a gate insulating layer. The drain is electrically connected to a cathode of a light emitting diode or an anode of the light emitting diode. The gate is located at a same layer with a first auxiliary electrode of the light emitting diode or a second auxiliary electrode of the light emitting diode; or, a pattern of the gate is same to a pattern of the first auxiliary electrode of the light emitting diode or a pattern of the second auxiliary electrode of the light emitting diode.

Optionally, first auxiliary electrodes of the plurality of light emitting diodes are connected to each other to form a planar electrode; and/or second auxiliary electrodes of the plurality of light emitting diodes are connected to each other to form a planar electrode.

Optionally, in a case in which an anode has a porous structure, a size of an aperture of the porous structure is in an order of microns or nanometers, and the size of the aperture is smaller than a size of one sub-pixel of the array substrate.

A third aspect of the present disclosure provides a light emitting device. The light emitting device includes an array substrate described above and a control chip. The control chip has a first voltage port and a second voltage port, wherein, an anode of a light emitting diode of the array substrate is electrically connected to the first voltage port, and a cathode of the light emitting diode of the array substrate is electrically connected to the second voltage port. In a case in which a number of holes injected into a light emitting layer is smaller than a number of electrons injected into the light emitting layer, the control chip further has a third voltage port and/or a fourth voltage port. The third voltage port is electrically connected to a first auxiliary electrode, and the fourth voltage port is electrically connected to a second auxiliary electrode. A voltage of the third voltage port is smaller than a voltage of the first voltage port, and a voltage of the fourth voltage port is smaller than a voltage of the second voltage port.

Alternatively, in a case in which the number of the electrons injected into the light emitting layer is smaller than the number of holes injected into the light emitting layer, the control chip further has a fifth voltage port and/or a sixth voltage port. The fifth voltage port is electrically connected to the first auxiliary electrode, and the sixth voltage port is electrically connected to the second auxiliary electrode. A voltage of the fifth voltage port is greater than the voltage of the first voltage port, and a voltage of the sixth voltage port is greater than the voltage of the second voltage port.

A fourth aspect of the present disclosure provides a display device. The display device includes an array substrate described above and a control chip. The control chip has a first voltage port and a second voltage port, wherein, an anode of a light emitting diode of the array substrate is electrically connected to the first voltage port, and a cathode of the light emitting diode is electrically connected to the second voltage port. In a case in which a number of holes injected into a light emitting layer is smaller than a number of electrons injected into the light emitting layer, the control chip further has a third voltage port and/or a fourth voltage port. The third voltage port is electrically connected to a first auxiliary electrode, and the fourth voltage port is electrically connected to a second auxiliary electrode. A voltage of the third voltage port is smaller than a voltage of the first voltage port, and a voltage of the fourth voltage port is smaller than a voltage of the second voltage port.

Alternatively, in a case in which the number of electrons injected into the light emitting layer is smaller than the number of holes injected into the light emitting layer, the control chip further has a fifth voltage port and/or a sixth voltage port. The fifth voltage port is electrically connected to the first auxiliary electrode, and the sixth voltage port is electrically connected to the second auxiliary electrode. A voltage of the fifth voltage port is greater than the voltage of the first voltage port, and a voltage of the sixth voltage port is greater than the voltage of the second voltage port.

BRIEF DESCRIPTION OF THE DRAWINGS

In order to describe technical solutions in embodiments of the present disclosure more clearly, the drawings to be used in the description of embodiments will be introduced briefly. Obviously, the drawings to be described below are merely some embodiments of the present disclosure, and a person of ordinary skill in the art can obtain other drawings according to those drawings without paying any creative effort.

DETAILED DESCRIPTION

The technical solutions in the embodiments of the present disclosure will be described clearly and completely with reference to the drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

The following contents are principles of how to solve a problem of an imbalance between an injection of electrons and an injection of holes in a light emitting diode by the embodiments of the present disclosure. If the number of holes injected into a light emitting layer is smaller than that of the electrons injected into the light emitting layer, an energy level of a hole transport layer may be reduced by an adjustment. Since the energy level is formed by an energy state occupied by the electrons, an injection barrier of the hole transport layer is reduced, and the number of the holes injected into the light emitting layer is increased, thereby the injection of the electrons and the injection of the holes are balanced. If the number of the electrons injected into the light emitting layer is smaller than the number of the holes injected into the light emitting layer, an energy level of an electron transport layer may be raised by the adjustment, so that an injection barrier of the electron transport layer is reduced, and the number of the electrons injected into the light emitting layer is increased, thereby making the injection of the electrons and the injection of the holes balanced.

For a Quantum dot light-emitting diode, if an injection barrier at an interface between a hole transport layer and a light emitting layer is higher, the number of the holes injected into the light emitting layer is smaller; and, if an injection barrier at an interface between an electron transport layer and a light emitting layer is higher, the number of electrons injected into the light emitting layer is smaller. For an Organic Light-Emitting Diode, if a hole mobility of a material of a hole transport layer is greater than an electron mobility of a material of an electron transport layer, the number of the electrons injected into the light emitting layer is smaller; and, if the hole mobility of the material of the hole transport layer is smaller than the electron mobility of the material of the electron transport layer, the number of the holes injected into the light emitting layer is smaller.

Figure 1:
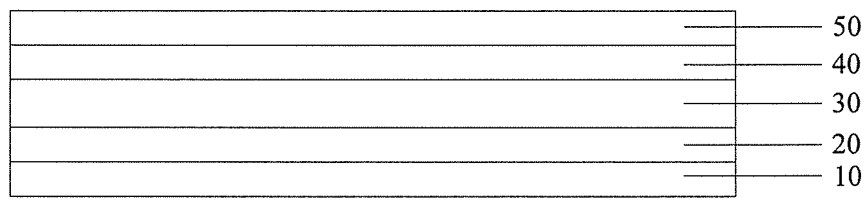
FIG. 1 is a structural diagram of a light emitting diode provided in the prior art.
Figure 2:
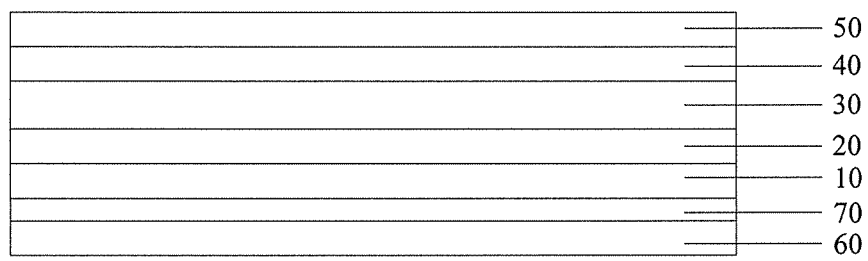
FIG. 2(a) is a first structural diagram of a light emitting diode provided in some embodiments of the present disclosure.
FIG. 2(b) is a second structural diagram of a light emitting diode provided in some embodiments of the present disclosure.
FIG. 2(c) is a third structural diagram of a light emitting diode provided in some embodiments of the present disclosure.
Figure 2:
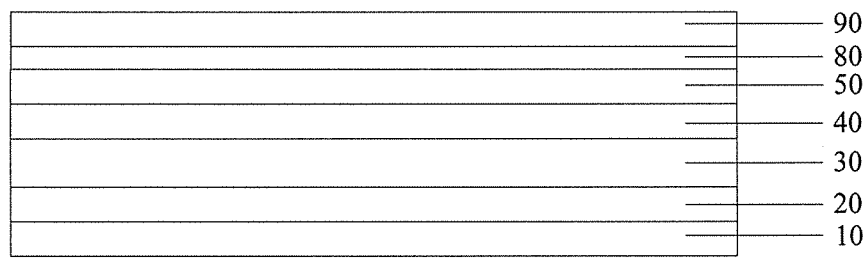
Figure 2:
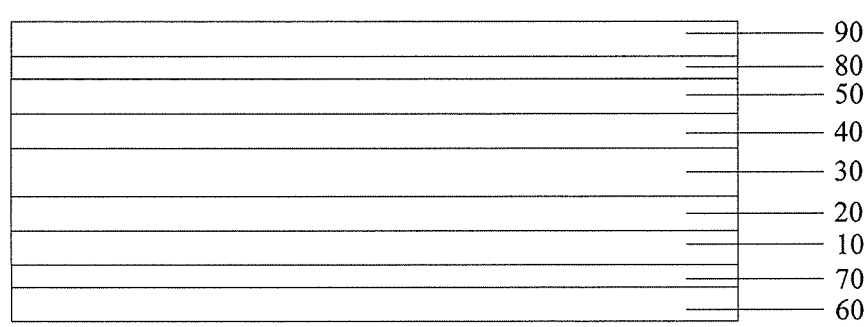

Some embodiments of the present disclosure provide a light emitting diode. As shown in FIG. 2 (a), FIG. 2 (b) and FIG. 2 (c), the light emitting diode includes an anode 10, a hole transport layer 20, a light emitting layer 30, an electron transport layer 40 and a cathode 50 sequentially disposed. The light emitting diode further includes a first auxiliary electrode 60 and a first insulating layer 70 which are disposed on a side of the anode 10 away from the hole transport layer 20, and the first insulating layer 70 is located between the first auxiliary electrode 60 and the anode 10; and/or, the light emitting diode further includes a second insulating layer 80 and a second auxiliary electrode 90 which are disposed on a side of the cathode 50 away from the electron transport layer 40, and the second insulating layer 80 is located between the second auxiliary electrode 90 and the cathode 50.

It should be noted that, firstly, a structure of the light emitting diode may be as shown in FIG. 2(a), and the first auxiliary electrode 60 and the first insulating layer 70 are further provided on the basis of the existing light emitting diode. The structure of the light emitting diode may also be as shown in FIG. 2(b), and the second insulating layer 80 and the second auxiliary electrode 90 are further provided on the basis of the existing light-emitting diode. Of course, the structure of the light emitting diode may be as shown in FIG. 2(c), wherein, the first auxiliary electrode 60, the first insulating layer 70, the second insulating layer 80 and the second auxiliary electrode 90 are further provided on the basis of the existing light-emitting diode.

Secondly, for the first insulating layer 70 and the second insulating layer 80, the first insulating layer 70 and the second insulating layer 80 may be dielectric layers, wherein the dielectric layers refers to thin film layers formed of a dielectric.

Based on this, in a case in which the light emitting diode includes the first insulating layer 70 and the second insulating layer 80, a material of the first insulating layer 70 can be same to or different from a material of the second insulating layer 80. Illustratively, materials of the first insulating layer 70 and the second insulating layer 80 may be at least one of: silicon nitride ($SiN_x$), silicon oxide ($SiO_y$), silicon oxynitride ($SiN_xO_y$), lithium fluoride (LiF), hafnium oxide ($HfO_2$), aluminum oxide ($Al_2O_3$), zirconium oxide ($ZrO_2$), polystyrene, polyvinyl chloride, polymethyl methacrylate, and the like.

Here, thicknesses of the first insulating layer 70 and the second insulating layer 80 are in a range of 5~2000 nm. Optionally, the thicknesses of the first insulating layer 70 and the second insulating layer 80 are in a range of 5~200 nm. In one embodiment, a thickness of the first insulating layer 70 is 5 nm. In another embodiment, the thickness of the first insulating layer 70 is 100 nm. In another embodiment, the thickness of the first insulating layer 70 is 200 nm. In another embodiment, the thickness of the first insulating layer 70 is 1000 nm. In another embodiment, the thickness of the first insulating layer 70 is 2000 nm. A thickness of the second insulating layer 80 may be, for example, 5 nm, 100 nm, 200 nm, 1000 nm, 2000 nm, or the like. The thickness of the first insulating layer 70 may be equal to or different from the thickness of the second insulating layer 80.

Thirdly, in a case in which the light emitting diode includes the first auxiliary electrode 60 and the second auxiliary electrode 90, a material of the first auxiliary electrode 60 can be same to or different from a material of the second auxiliary electrode 90. Illustratively, materials of the first auxiliary electrode 60 and the second auxiliary electrode 90 may be at least one of: metal elements, such as aluminum (Al), silver (Ag), magnesium (Mg), gold (Au), molybdenum (Mo), chromium (Cr), lithium (Ti) and copper (Cu), alloys, or metal oxides, such as indium zinc oxide (IZO), indium tin oxide (ITO), and the like.

In addition, thicknesses of the first auxiliary electrode 60 and the second auxiliary electrode 90 are in a range of 2~200 nm.

Fourthly, a material of the hole transport layer 20 is not limited. For example, it may be at least one of: tungsten trioxide ($WO_3$), nickel oxide ($NiO_x$), poly (9,9-dioctylfluorene-co-N-(4-butylbenzyl) diphenylamine) TFB, poly (9-vinyl carbazole) (PVK), N,N'-diphenyl-N,N'-(1-naphthyl)-1,1'-biphenyl-4,4'-diamine (NPB), 4,4'-bis(N-carbazole)-1,1'-biphenyl (CBP), copper phthalocyanine (CuPc), poly[bis(4-phenyl)(4-butylphenyl)amine]; 4-butyl-N,N-diphenylaniline homopolymer; aniline, 4-butyl-N,N-diphenyl-homopolymer (Poly-TPD). A material of the electron transport layer 40 is not limited. For example, it may be at least one of zinc oxide (ZnO), tin oxide ($SnO_x$), titanium dioxide ($TiO_2$), tris(8-quinolinol aluminum) ($Alq_3$), 1,3,5-tris(1-phenyl-1H-benzimidazol-2-yl)benzene (TPBI), 2,2'-(1,3-phenyl)bis[5-(4-tert-butyl phenyl)-1,3,4-oxadiazole] (OXD-7) and the like.

In addition, in the light emitting diode of the embodiments of the present disclosure, only the electron transport layer 40 is provided. Those skilled in the art should understand that, in the absence of an electron injection layer, in order to ensure that the light emitting diode may emit light normally, the electron transport layer 40 has functions of both electron transmission and electron injection. Similarly, in some embodiments of the present disclosure, only the hole transport layer 20 is provided. In the absence of a hole injection layer, the hole transport layer 20 has functions of both hole transport and hole injection.

Fifthly, a light emitting material of the light emitting layer 30 is not limited. The light emitting material may include a quantum dot light emitting material. In this case, the light emitting diode is a quantum dot light emitting diode. The light emitting material of the light emitting layer 30 may include an organic electroluminescent material. In this case, the light emitting diode is an organic light emitting diode.

In a case in which the material of the light emitting layer 30 includes the quantum dot light emitting material, a quantum dot may be a II-VI or III-V compound semiconductor nanocrystal, such as gallium arsenide (GaAs), cadmium sulfide (CdS), cadmium telluride (CdTe), cadmium zinc (ZnSe), cadmium selenide (CdSe), mercury sulfide (HgS), zinc oxide (ZnO), zinc sulfide (ZnS), indium antimonide (InSb), zinc telluride (ZnTe), indium arsenide (InAs), indium phosphide (InP), or the quantum dot may be core-shell structured nanocrystals and alloy nanocrystals which are composed of semiconductor nanocrystals, for example, the quantum dot with CdSe as a core and CdS as a shell. The quantum dot may be selected according to a color of light which needs to be emitted.

In a case in which the light emitting layer 30 includes an organic electroluminescent material, a corresponding organic electroluminescent material may be selected according to a color of light which needs to be emitted. The organic electroluminescent material may be at least one of, for example, polyphenylene vinylene (PPV), polyphenylene vinyl derivative, diazole derivative, triarylamine derivative, onion derivative, 1,3-butadiene derivative, DCM (4-dicyanomethyl-2-methyl-6-(p-dimethylaminostyrene)H-pyran), dizopyridine derivatives, perylenes, aryl substituted anthracenes, and fluorenes.

Here, a thickness of the light emitting layer 30 is in a range of 5~200 nm.

Sixthly, the light emitted from the light emitting layer 30 of the light emitting diode may be emitted only from the anode 10 or may be emitted only from the cathode 50. Of course, the light emitted may also be emitted from both the anode 10 and the cathode 50. In a case in which the light emitted from the light emitting layer 30 is emitted from the anode 10, materials of the anode 10, the first auxiliary electrode 60 and the first insulating layer 70 are all transparent materials, and a material of the anode 10 may be at least one of, for example, IZO, ITO, or a relatively thin metal. In this case, a material of the cathode 50 may be, for example, a metal element such as Al, Ag, Mg, Au, Mo, Cr, Ti, Cu, or alloy, or the like. In a case in which the light emitted from the light emitting layer 30 is emitted from the cathode 50, materials of the cathode 50, the second auxiliary electrode 90 and the second insulating layer 80 are all transparent materials. For example, the material of the cathode 50 may be at least one of IZO, ITO, or a relatively thin metal. In this case, the material of the anode 10 may be, for example, a metal element such as Al, Ag, Mg, Au, Mo, Cr, Ti, Cu, or alloy, or the like. In a case in which the light emitted from the light emitting layer 30 is emitted from both the anode 10 and the cathode 50, materials of the anode 10, the first auxiliary electrode 60, the first insulating layer 70, the cathode 50, the second auxiliary electrode 90 and the second insulating layer 80 are all transparent materials. In this case, materials of the anode 10 and the cathode 50 may be at least one of, for example, IZO, ITO, or a relatively thin metal.

Here, the anode 10 may be disposed adjacent to a base substrate, or the cathode 50 may also be disposed adjacent to the base substrate. Thicknesses of anode 10 and the cathode 50 are in a range of 2~200 nm.

Seventhly, the magnitudes of voltages applied to the anode 10, the cathode 50, the first auxiliary electrode 60 and the second auxiliary electrode 90 are not limited. The magnitudes of voltages may be adjusted according to the number of the electrons and the holes injected of the light emitting diode to ensure a balance between the injection of the electrons and the injection of the holes.

The embodiments of the present disclosure provide the light emitting diode. In a case in which the number of the holes injected into the light emitting layer 30 is smaller than the number of the electrons injected into the light emitting layer 30, since the light emitting diode includes the first auxiliary electrode 60 and the first insulating layer 70 which are disposed on the side of the anode 10 away from the hole transport layer 20, a voltage applied to the first auxiliary electrode 60 may be smaller than a voltage applied to the anode 10. In this case, the electrons will accumulate at an interface between the anode 10 and the first insulating layer 70, in this way a polarized electric field will be generated at the interface between the anode 10 and the hole transport layer 20. Meanwhile, the electrons in the hole transport layer 20 move toward the anode 10, and the energy level of the hole transport layer 20 is reduced, thereby reducing the injection barrier of the hole transport layer 20, so that more holes are injected into the light emitting layer 30. In this may, the problem of an imbalance between the injection of the electrons and the injection of the holes may be solved. Alternatively, a voltage applied to the second auxiliary electrode 90 may be smaller than a voltage applied to the cathode 10, so that the energy level of the electron transport layer 40 is reduced and the injection barrier of the electron transport layer 40 is increased to reduce the number of the electrons injected into the light emitting layer 30.

In a case in which the number of the electrons injected into the light emitting layer 30 is smaller than the number of the holes injected into the light emitting layer 30, since the light emitting diode includes the second insulating layer 80 and the second auxiliary electrode 90 which are disposed on the side of the cathode 50 away from the electron transport layer 40, a voltage applied to the second auxiliary electrode 90 is greater than a voltage applied to the cathode 50, and the holes will accumulate at an interface between the second auxiliary electrode 90 and the second insulating layer 80, so that a polarized electric field will be generated at the interface between the cathode 50 and the electron transport layer 40. Meanwhile, the electrons in the cathode 50 move toward the electron transport layer 40, and the energy level of the electron transport layer 40 is raised, thereby the injection barrier of the electron transport layer 40 is decreased, so that the electrons injected into the light emitting layer 30 increase. In this way, the problem of imbalance between the injection of the electrons and the injection of the holes may be solved. Alternatively, a voltage applied to the first auxiliary electrode 60 may be greater than a voltage applied to the anode 10, so that the energy level of the hole transport layer 20 is raised and the injection barrier of the hole transport layer 20 is increased to reduce the number of the holes injected into the light emitting layer 30.

It should be noted that, in the case in which the number of the holes injected into the light emitting layer 30 is smaller than the number of the electrons injected into the light emitting layer 30, if the voltage applied to the second auxiliary electrode 90 is smaller than the voltage applied to the cathode 50, it will result in an increase of the power consumption of the light emitting diode. Thus, in some embodiments, in the case in which the number of the holes injected into the light emitting layer 30 is smaller than the number of the electrons injected into the light emitting layer 30, as shown in FIG. 2(a), only the first auxiliary electrode 60 and the first insulating layer 70 are provided in the light emitting diode, and the second auxiliary electrode 90 and the second insulating layer 80 are not provided in the light emitting diode. And the voltage applied to the first auxiliary electrode 60 is smaller than the voltage applied to the anode 10 during the application.

Similarly, in the case in which the number of the electrons injected into the light emitting layer 30 is smaller than the number of the holes injected into the light emitting layer 30, if the voltage applied to the first auxiliary electrode 60 is greater than the voltage applied to the anode 10, it will result in the increase of the power consumption of the light emitting diode. Thus, in some embodiments, in the case in which the number of the electrons injected into the light emitting layer 30 is smaller than the number of the holes injected into the light emitting layer 30, as shown in FIG. 2(b), only the second auxiliary electrode 90 and the second insulating layer 80 are provided in the light emitting diode, and the first auxiliary electrode 60 and the first insulating layer 70 are not provided in the light emitting diode. Moreover, the voltage applied to the second auxiliary electrode 90 is greater than the voltage applied to the cathode 50 during usage.

Based on the above, for an existing quantum dot light emitting diode, the hole transport layer 20 has a higher injection barrier generally, that is, the number of the holes injected into the light emitting layer 30 is smaller than the number of the electrons injected into the light emitting layer 30. Therefore, as shown in FIG. 2(a), the first auxiliary electrode 60 and the first insulating layer 70 may be disposed on the side of the anode 10 away from the hole transport layer 20, and the voltage applied to the first auxiliary electrode 60 may be smaller than the voltage applied to the anode 10 during usage.

For an existing organic electroluminescent diode the hole mobility of a hole transporting material is greater than the electron mobility of the electron transporting layer materials generally, i.e., the number of the electrons injected into the light emitting layer 30 is smaller than that of the holes injected into the light emitting layer 30. Therefore, as shown in FIG. 2(b), the second insulating layer 80 and the second auxiliary electrode 90 may be disposed on the side of the cathode 50 away from the electron transport layer 40, and a voltage applied to the second auxiliary electrode 90 is greater than that applied to the cathode 50 during usage.

Optionally, the anode 10 and/or the cathode 50 have/has a mesh structure or a porous structure.

Herein, a porous structure means that a material of the anode 10 and/or the cathode 50 contains a plurality of hollows interconnected or closed. Here, sizes and an arrangement of apertures are not limited.

In addition, the mesh structure or the porous structure may be formed by a method such as vacuum coating, lift off, micro sodium processing, 3D printing or the like. Illustratively, in a case in which the porous structure is formed, a plurality of organic material balls may be deposited at a position where the anode 10 or the cathode 50 is going to be disposed, then a conductive film having a certain thickness is formed by vacuum evaporation, and the organic material balls are removed by the lift off process. In this way, the anode 10 or the cathode 50 having the porous structure may be acquired. Based on this, it is also possible to acquire porous structures having special pores by means of ink jet printing, transfer printing, nanoimprint, 3D printing of nanowires or the like.

It should be noted that, the anode 10 and/or the cathode 50 provided in the embodiments of the present disclosure have/has the mesh structure or the porous structure, but the embodiments of the present disclosure are not limited thereto, and other structures which are favorable for the movement of the electrons are all belong to the protection scope of the present disclosure.

In the embodiments of the present disclosure, in a case in which the anode 10 has the mesh structure or the porous structure, it facilitates the movement of the electrons in the anode 10, so that the injection of the electrons and the injection of the holes may be quickly balanced and the luminous efficiency of the light emitting diode is improved. In a case in which the cathode 50 has the mesh structure or the porous structure, it facilitates the movement of the electrons in the cathode 50, so that the injection of the electrons and the injection of the holes may be quickly balanced and the luminous efficiency of the light emitting diode is improved.

Figure 3:
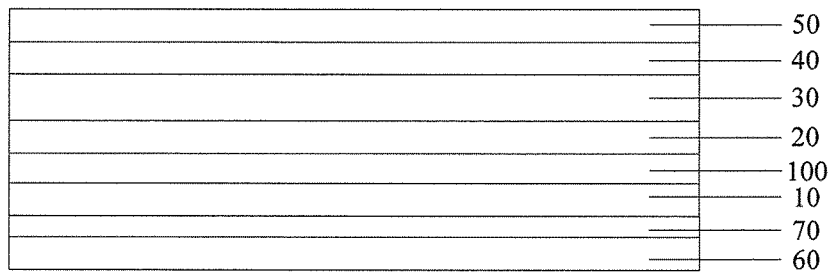
FIG. 3(a) is a fourth structural diagram of a light emitting diode provided in some embodiments of the present disclosure.
FIG. 3(b) is a fifth structural diagram of a light emitting diode provided in some embodiments of the present disclosure.
FIG. 3(c) is a sixth structural diagram of a light emitting diode provided in some embodiments of the present disclosure.
Figure 3:
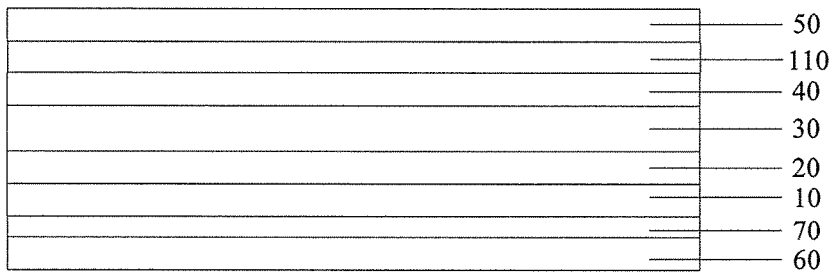
Figure 3:
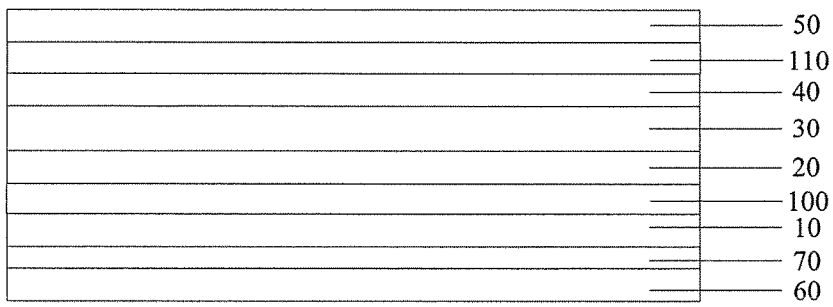

Optionally, as shown in FIGS. 3(a), 3(b) and 3(c), the light emitting diode further includes a hole injection layer 100 disposed between the anode 10 and the hole transport layer 20, and/or an electron injection layer 110 disposed between the cathode 50 and the electron transport layer 40.

The structure of the light emitting diode may be as shown in FIG. 3(a), wherein, the light emitting diode only further includes the hole injection layer 100 disposed between the anode 10 and the hole transport layer 20. The structure of the light emitting diode may also be as shown in FIG. 3(b), wherein, the light emitting diode only further includes the electron injection layer 110 disposed between the cathode 50 and the electron transport layer 40. Of course, the structure of the light emitting diode may also be as shown in FIG. 3(c), wherein, the light emitting diode includes both the hole injection layer 100 disposed between the anode 10 and the hole transport layer 20 and the electron injection layer 110 disposed between the cathode 50 and the electron transport layer 40.

Here, a material of the hole injection layer 100 is not limited, and for example, it may be LG101, molybdenum oxide ($MoO_x$), fullerene (C60), poly(3,4-ethylenedioxythiophene):polystyrenesulfonate (PEDOT:PSS) or cuprum phthalocyanine (CuPc). A material of the electron injection layer 110 is not limited, and for example, it may be lithium fluoride (LiF), polyethyleneimine, or the like.

In some embodiments of the present disclosure, in a case in which the light emitting diode further includes the hole injection layer 100 disposed between the anode 10 and the hole transport layer 20 and/or the electron injection layer 110 disposed between the cathode 50 and the electron transport layer 40, the hole injection layer 100 may improve an injection rate of the holes into the light-emitting layer 30 and improve an injection capability of the holes. The electron injection layer 110 may improve an injection capability of the electrons. Therefore, it is beneficial to improve the light emitting efficiency of the light-emitting diode.

In a case in which the light emitting diode further includes the hole injection layer 100 and the electron injection layer 110, the injection of the holes into the light emitting layer 30 is facilitated when each of thicknesses of the hole transport layer 20 and the hole injection layer 100 ranges from 1 nm to 200 nm, and the injection of the electrons into the light emitting layer 30 is facilitated when thicknesses of the electron injection layer 110 and the electron transport layer 40 are in the range of 1~200 nm. Therefore, in some embodiments, each of thicknesses of the hole transport layer 20, the hole injection layer 100, the electron injection layer 110 and the electron transport layer 40 ranges from 1 nm to 200 nm.

Taking the hole transport layer 20 as an example, in an embodiment, the hole transport layer 20 has a thickness of 1 nm. In another embodiment, the hole transport layer 20 has a thickness of 100 nm. In another embodiment, the hole transport layer 20 has a thickness of 200 nm. The thicknesses of the hole injection layer 100, the electron injection layer 110, and the electron transport layer 40 may also be selected from 1 nm, 100 nm, 200 nm, and the like. Here, the thicknesses of the hole transport layer 20, the hole injection layer 100, the electron injection layer 110 and the electron transport layer 40 may be the same or may be not exactly the same.

Figure 4:
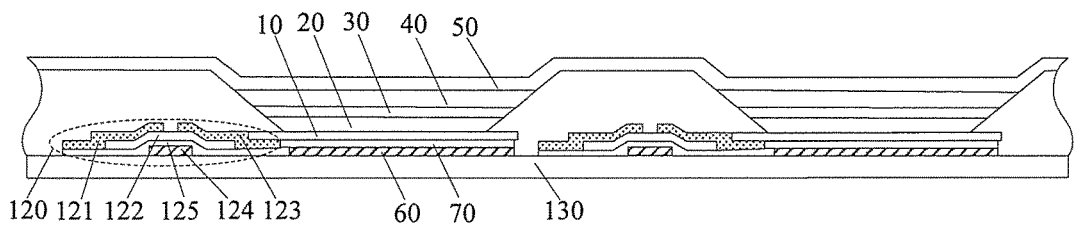
FIG. 4(a) is a first structural diagram of an array substrate provided in some embodiments of the present disclosure.
FIG. 4(b) is a second structural diagram of an array substrate provided in some embodiments of the present disclosure.
FIG. 4(c) is a third structural diagram of an array substrate provided in some embodiments of the present disclosure.
Figure 4:
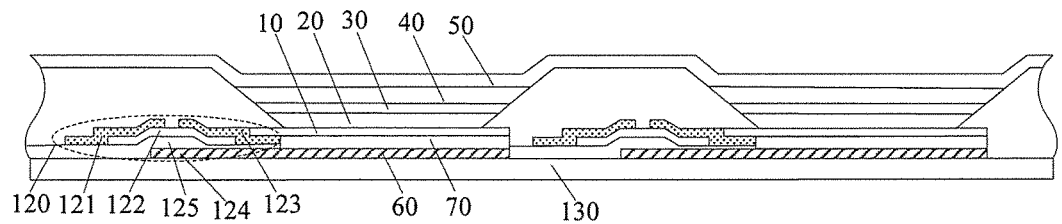
Figure 4:
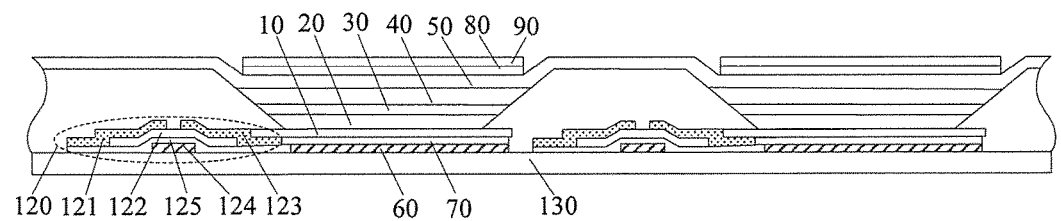
Figure 5:
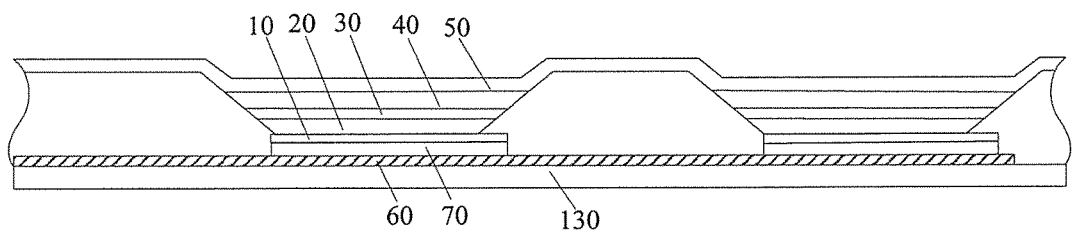
FIG. 5 is a fourth structural diagram of an array substrate provided in some embodiments of the present disclosure.

Some embodiments of the present disclosure provide an array substrate, and the array substrate includes a plurality of light-emitting diodes described above arranged in a matrix, as shown in FIG. 4 (a) to FIG. 4 (c) and FIG. 5.

It should be noted that, in FIGS. 4(a) to 4 (c) and FIG. 5, it is taking the anode 10 being disposed adjacent to a base substrate 130 as an example. A second auxiliary electrode 90 and a second insulating layer 80 are not illustrated in FIG. 4 (a), FIG. 4 (b) and FIG. 5.

The light emitting diode may be a passive matrix driven light emitting diode as shown in FIG. 5, or may be an active matrix driven light emitting diode as shown in FIG. 4(a) to FIG. 4(c). In a case in which the light emitting diode is the active matrix driving light emitting diode, the array substrate further includes a thin film transistor 120.

The embodiments of the present disclosure provide the array substrate. The array substrate includes the plurality of light emitting diodes described above. Since the light emitting diode further includes a first auxiliary electrode 60 and a first insulating layer 70 disposed on a side of the anode 10 away from the hole transport layer 20, and/or a second insulating layer 80 and a second auxiliary electrode 90 disposed on a side of the cathode 50 away from the electron transport layer 40, the injection barrier of the hole transport layer 20 and the electron transport layer 40 may be controlled by controlling the voltage applied to the first auxiliary electrode 60 and/or the second auxiliary electrode 90, and an injection of electrons of the light emitting diode and an injection of holes can be balanced, thereby helping to improve the lifetime of the light emitting diode and reduce the power consumption of the light emitting diode.

Optionally, as shown in FIGS. 4(a), 4(b) and 4(c), the array substrate further includes the thin film transistor 120. The thin film transistor 120 includes a source 121, an active layer 122, a drain 123, a gate 124 and a gate insulating layer 125. The drain 123 is electrically connected to the cathode 50 of the light emitting diode or the anode 10 of the light emitting diode. As shown in FIGS. 4(a) and 4(c), the gate 124 is located at a same layer with the first auxiliary electrode 60 of the light emitting diode or the second auxiliary electrode 90 of the light emitting diode (in FIGS. 4(a) and 4(c), it is taking the gate electrode 124 and the first auxiliary electrode 60 are located at the same layer as an example). Alternatively, as shown in FIG. 4(b), a pattern of the gate 124 is same to a pattern of the first auxiliary electrode 60 or a pattern of the second auxiliary electrode 90 of the light emitting diode (in FIG. 4(b), it is taking the pattern of the gate electrode 124 is same to the pattern of the first auxiliary electrode 60 as an example).

It should be noted that, in FIGS. 4(a) and 4 (b) of the present disclosure, it is taking the light emitting diode includes the first auxiliary electrode 60 and the first insulating layer 70, and the gate 124 and the first auxiliary electrode 60 are located at the same layer or the pattern of the gate electrode 124 is same to the pattern of the first auxiliary electrode 60 as an example, but the present disclosure is not limited thereto. Those skilled in the art should understand that, if the drain electrode 123 is electrically connected to the cathode 50 of the light emitting diode, the plurality of light emitting diodes on the array substrate share the anode 10; and if the drain electrode 123 is electrically connected to the anode 10 of the light emitting diode, the plurality of light emitting diodes on the array substrate share the cathode 50.

Here, in the embodiments of the present disclosure, it is taking the light emitting diode and the thin film transistor 120 being disposed on the base substrate 130 as an example. The arrangement of the thin film transistor 120 and the light emitting diode may be as shown in FIGS. 4(a) and 4(b), but the arrangement of the thin film transistor 120 and the light emitting diode is not limited thereto. A material of the base substrate 130 may be, for example, polyethylene, silica, polypropylene, polystyrene, or the like.

As shown in FIG. 4(b), in a case in which the pattern of the gate 124 is same to the pattern of the first auxiliary electrode 60 of the light emitting diode or to the pattern of the second auxiliary electrode 90 of the light emitting diode, a size of the gate 124 is greater than a size of an ordinary thin film transistor. The gate 124 may function as the gate 124, and may also function as the first auxiliary electrode 60. On this basis, in the case in which the array substrate further includes the thin film transistor 120, the gate insulating layer 125 of the thin film transistor 120 may be formed simultaneously with the formation of the first insulating layer 70 or the second insulating layer 80, or may be formed separately.

In the embodiments of the present disclosure, since the gate 124 is located at the same layer with the first auxiliary electrode 60 of the light emitting diode or the second auxiliary electrode 90 of the light emitting diode, or the pattern of the gate electrode 124 is same to the pattern of the first auxiliary electrode 60 of the light emitting diode or to the pattern of the second auxiliary electrode 90 of the light emitting diode, the first auxiliary electrode 60 or the second auxiliary electrode 90 may be formed simultaneously while the gate electrode 124 is formed, so that the formation process of the array substrate may be simplified.

Optionally, as shown in FIG. 5, first auxiliary electrodes 60 of the plurality of light emitting diodes are connected to each other to form a planar electrode, and/or second auxiliary electrodes 90 of the plurality of light emitting diodes are connected to each other to form the planar electrode (in FIG. 5, it is taking first auxiliary electrodes 60 are connected to each other to form the planar electrode as an example).

In an embodiment, in a case in which the first auxiliary electrodes 60 of the plurality of light emitting diodes are connected to each other to form the planar electrode, first insulating layers 70 of the plurality of light emitting diodes may not be connected to each other or may be connected to each other to form a planar shape. Similarly, in a case in which the second auxiliary electrodes 90 of the plurality of light emitting diodes are connected to each other to form the planar electrode, second insulating layers 80 of the plurality of light emitting diodes may not be connected to each other or may be connected to each other to form the planar shape.

According to the embodiments of the present disclosure, on one hand, in a case in which the first auxiliary electrode 60 or the second auxiliary electrode 90 is the planar electrode, the manufacturing process of the array substrate may be simplified. On the other hand, the first auxiliary electrode 60 is taken as an example, if the first auxiliary electrodes 60 of the plurality of light emitting diodes are not connected to each other, the first auxiliary electrodes 60 need to be respectively connected to voltage ports, thereby the difficulty of production process of the array substrate is increased. However, in the embodiments of the present disclosure, since the first auxiliary electrodes 60 of the plurality of light emitting diodes are connected to each other, it is only necessary to connect a voltage port to any one of the first auxiliary electrodes 60, or since the second auxiliary electrodes 90 of the plurality of light emitting diodes are connected to each other, it is only necessary to connect the voltage port to any one of the second auxiliary electrodes 90.

Based on the above, it should be noted that, in a case in which the gate 124 is located at the same layer with the first auxiliary electrode 60 of the light emitting diode or the second auxiliary electrode 90, or the pattern of the gate electrode 124 is same to the pattern of the first auxiliary electrode 60 of the light emitting diode or to the pattern of the second auxiliary electrode 90, in order to ensure a normal light emission of the array substrate, the first auxiliary electrodes 60 or the second auxiliary electrodes 90 cannot be connected to each other to form a planar electrode. But, the first auxiliary electrodes 60 or the second auxiliary electrodes 90 which are located at the same row may be connected to each other to form a stripe electrode.

In a case in which the anode 10 has a porous structure, if a size of an aperture of the porous structure is large, a performance of the anode 10 may be affected. Based on this, in the embodiments of the present disclosure, optionally, the size of the aperture of the porous structure is in an order of microns or nanometers, and the size of the aperture is smaller than a size of one sub-pixel of the array substrate.

Figure 6:
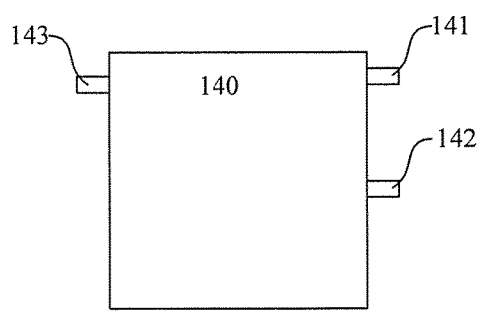
FIG. 6(a) is a first structural diagram of a control chip provided in some embodiments of the present disclosure.
FIG. 6(b) is a second structural diagram of a control chip provided in some embodiments of the present disclosure.
FIG. 6(c) is a third structural diagram of a control chip provided in some embodiments of the present disclosure.
Figure 6:
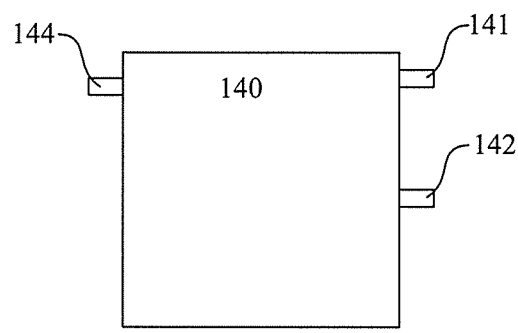
Figure 6:
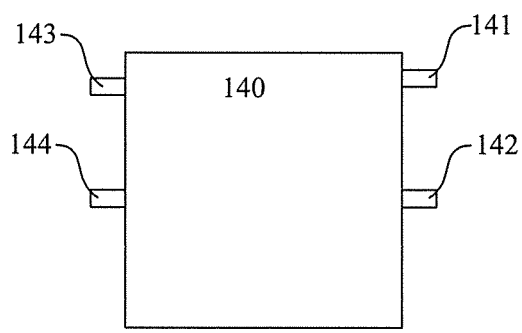
Figure 7:
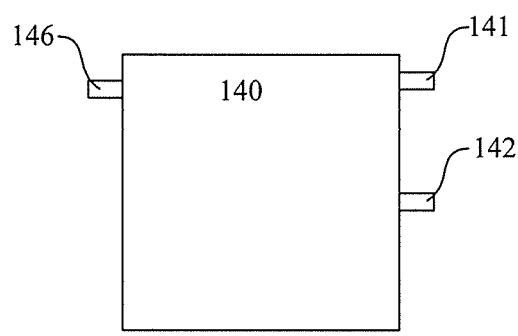
FIG. 7(a) is a fourth structural diagram of a control chip provided in some embodiments of the present disclosure.
FIG. 7(b) is a fifth structural diagram of a control chip provided in some embodiments of the present disclosure.
FIG. 7(c) is a sixth structural diagram of a control chip provided in some embodiments of the present disclosure.
Figure 7:
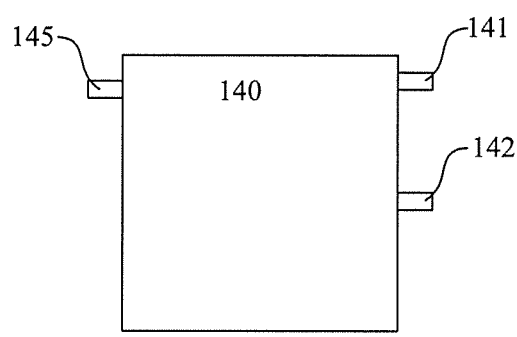
Figure 7:
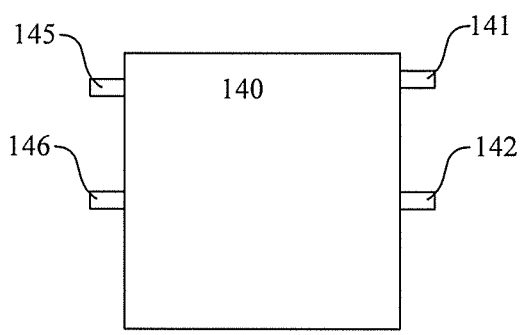

Some embodiments of the present disclosure provide a light emitting device. The light emitting device includes an array substrate described above and a control chip 140, as shown in FIGS. 6(a) to 6 (c) and FIGS. 7 (a) to 7 (c). The control chip 140 has a first voltage port 141 and a second voltage port 142. An anode 10 of a light emitting diode of the array substrate is electrically connected to the first voltage port 141. A cathode 50 of the light emitting diode is electrically connected to the second voltage port 142.

If a number of holes injected into a light emitting layer 30 is smaller than a number of electrons injected into the light emitting layer 30, as shown in FIGS. 6(a)-6(c), the control chip further has a third voltage port 143 and/or a fourth voltage port 144. The third voltage port 143 is electrically connected to a first auxiliary electrode 60, and the fourth voltage port 144 is electrically connected to a second auxiliary electrode 90. A voltage of the third voltage port 143 is smaller than a voltage of the first voltage port 141, and a voltage of the fourth voltage port 144 is smaller than a voltage of the second voltage port 142.

Alternatively, if the number of the electrons injected into the light emitting layer is smaller than that of the holes injected into the light emitting layer, as shown in FIGS. 7(a)-7(c), the control chip further has a fifth voltage port 145 and/or a sixth Voltage port 146. The fifth voltage port 145 is electrically connected to the first auxiliary electrode 60, and the sixth voltage port 146 is electrically connected to the second auxiliary electrode 90. A voltage of the fifth voltage port 145 is greater than the voltage of the first voltage port 141, and a voltage of the sixth voltage port 146 is greater than the voltage of the second voltage port 142.

In one embodiment, the light emitting device may be configured to provide a light source for a liquid crystal display panel.

Here, voltages of the first voltage port 141, the second voltage port 142, the third voltage port 143, the fourth voltage port 144, the fifth voltage port 145 and the sixth voltage port 146 may be adjusted as needed, so as to balance an injection of the electrons and an injection of the holes.

The embodiments of the present disclosure provide a light emitting device and the light emitting device includes the light emitting diode described above. In a case in which the number of the holes injected into the light emitting layer 30 is smaller than the number of the electrons injected into the light emitting layer 30, since the light emitting diode includes the first auxiliary electrode 60 and the first insulating layer 70 which are disposed on a side of the anode 10 away from a hole transport layer 20, a voltage applied to the first auxiliary electrode 60 may be smaller than a voltage applied to the anode 10. In this case, the electrons will accumulate at an interface between the anode 10 and the first insulating layer 70, in this way, a polarized electric field will be generated at an interface between the anode 10 and the hole transport layer 20. Meanwhile, the electrons in the hole transport layer 20 move toward the anode 10, and an energy level of the hole transport layer 20 is reduced, so that an injection barrier of the hole transport layer 20 is reduced, thereby more holes are injected into the light emitting layer 30. In this way, a problem of an imbalance between the injection of the electrons and the injection of the holes may be solved. Alternatively, a voltage applied to the second auxiliary electrode 90 may be smaller than a voltage applied to the cathode 50, so that an energy level of the electron transport layer 40 is reduced and an injection barrier of the electron transport layer 40 is increased to reduce the number of the electrons injected into the light emitting layer 30.

In a case in which the number of the electrons injected into the light emitting layer is smaller than the number of the holes injected into the light emitting layer, since the light emitting diode includes the second insulating layer 80 and the second auxiliary electrode 90 which are disposed on a side of the cathode 50 away from an electron transport layer 40, a voltage applied to the second auxiliary electrode 90 is greater than a voltage applied to the cathode 50, and the holes will accumulate at an interface between the second auxiliary electrode 90 and the second insulating layer 80, so that a polarized electric field will be generated at an interface between the cathode 50 and the electron transport layer 40. Meanwhile, the electrons in the cathode 50 move toward the electron transport layer 40, and an energy level of the electron transport layer 40 is raised, thereby an injection barrier of the electron transport layer 40 is decreased, so that the electrons injected into the light emitting layer 30 increase. In this way, the problem of the imbalance between the injection of the electrons and the injection of the holes may be solved. Alternatively, a voltage applied to the first auxiliary electrode 60 may be greater than a voltage applied to the anode 10, so that an energy level of the hole transport layer 20 is raised and the injection barrier of the hole transport layer 20 is increased to reduce the number of the holes injected into the light emitting layer 30.

Based on the above, in the case in which the number of the holes injected into the light emitting layer 30 is smaller than the number of the electrons injected into the light emitting layer 30, in order to reduce a power consumption of the light emitting diode, in the embodiments of the present disclosure, the light emitting diode includes the first auxiliary electrode 60 and the first insulating layer 70 optionally. The control chip has a third voltage port 143 but does not have the fourth voltage port 144, and the third voltage port 143 is electrically connected to the first auxiliary electrode 60. Similarly, in the case in which the number of the electrons injected into the light emitting layer 30 is smaller than the number of the holes injected into the light emitting layer 30, in order to reduce the power consumption of the light emitting diode, in the embodiments of the present disclosure, the light emitting diode includes the second auxiliary electrode 90 and the second insulating layer 80 optionally. The control chip has a sixth voltage port 146 but does not have the fifth voltage port 145, and the sixth voltage port 146 is electrically connected to the second auxiliary electrode 90.

Some embodiments of the present disclosure further provide a display device. The display device includes an array substrate described above and a control chip 140. The control chip 140 has a first voltage port 141 and a second voltage port 142. An anode 10 of a light emitting diode of the array substrate is electrically connected to the first voltage port 141, and a cathode 50 is electrically connected to the second voltage port 142.

If a number of holes injected into a light emitting layer 30 is smaller than that of a number of electrons injected into the light emitting layer 30, the control chip also has a third voltage port 143 and/or a fourth voltage port 144. The third voltage port 143 is electrically connected to a first auxiliary electrode 60, and the fourth voltage port 144 is electrically connected to a second auxiliary electrode 90. A voltage of the third voltage port 143 is smaller than a voltage of the first voltage port 141, and a voltage of the fourth voltage port 144 is smaller than a voltage of the second voltage port 142.

Alternatively, if the number of the electrons injected into the light emitting layer 30 is smaller than the number of the holes injected into the light emitting layer 30, the control chip 140 also has a fifth voltage port 145 and/or a sixth voltage port 146. The fifth voltage port 145 is electrically connected to the first auxiliary electrode 60, and the sixth voltage port 146 is electrically connected to the second auxiliary electrode 90. A voltage of the fifth voltage port 145 is greater than the voltage of the first voltage port 141, and the voltage of the sixth voltage port 146 is greater than the voltage of the second voltage port 142.

In an embodiment, the display device may be any device that displays a static image (e.g., a still image) or a dynamic image (e.g., video). The display device may also be any device that displays an image as a text or as a picture. Illustratively, it is contemplated that the embodiments may be implemented in or associated with a variety of electronic devices such as, but not limited to, mobile phones, wireless devices, personal data assistants (PDAs), hand-held computers, portable computers, GPS receivers/navigators, cameras, MP4 video players, camcorders, game consoles, watches, clocks, calculators, TV monitors, flat panel displays, computer monitors, car displays (e.g., Odometer displays, etc.), navigators, cockpit controllers and/or monitors, displays of camera views (e.g., displays of rear-view cameras in vehicles), electronic photographs, electronic billboards or signs, projectors, building structures, packaging and aesthetic structures (e.g., displays for a piece of jewelry) and so on.

In an embodiment, voltages of the first voltage port 141, the second voltage port 142, the third voltage port 143, the fourth voltage port 144, the fifth voltage port 145 and the sixth voltage port 146 may be adjusted according to requirements to balance the injection of the electrons and the injection of the holes.

The embodiments of the present disclosure provide a display device including the light emitting diode described above. In the case in which the number of the holes injected into the light emitting layer 30 is smaller than the number of the electrons injected into the light emitting layer 30, since the light emitting diode includes the first auxiliary electrode 60 and the first insulating layer 70 which are disposed on the side of the anode 10 away from the hole transport layer 20, the voltage applied to the first auxiliary electrode 60 may be smaller than the voltage applied to the anode 10. In this case, the electrons will accumulate at the interface between the anode 10 and the first insulating layer 70, in this way a polarized electric field will be generated at the interface between the anode 10 and the hole transport layer 20. Meanwhile, the electrons in the hole transport layer 20 move toward the anode 10, and the energy level of the hole transport layer 20 is reduced, so that the injection barrier of the hole transport layer 20 is reduced, thereby more holes are injected into the light emitting layer 30. In this way, the problem of the imbalance between the injection of the electrons and the injection of the holes may be solved. Alternatively, the voltage applied to the second auxiliary electrode 90 may be smaller than the voltage applied to the cathode 50, so that the energy level of the electron transport layer 40 is reduced and the injection barrier of the electron transport layer 40 is increased to reduce the number of the electrons injected into the light emitting layer 30.

In a case in which the number of the electrons injected into the light emitting layer is smaller than the number of the holes injected into the light emitting layer, since the light emitting diode includes the second insulating layer 80 and the second auxiliary electrode 90 which are disposed on the side of the cathode 50 away from the electron transport layer 40, the voltage applied to the second auxiliary electrode 90 is greater than the voltage applied to the cathode 50, and the holes will accumulate at the interface between the second auxiliary electrode 90 and the second insulating layer 80, so that a polarized electric field will be generated at the interface between the cathode 50 and the electron transport layer 40. Meanwhile, the electrons in the cathode 50 move toward the electron transport layer 40, and the energy level of the electron transport layer 40 is raised, thereby the injection barrier of the electron transport layer 40 is decreased, so that the electrons injected into the light emitting layer 30 increase. In this way, the problem of the imbalance between the injection of the electrons and the injection of the holes may be solved. Alternatively, the voltage applied to the first auxiliary electrode 60 may be greater than the voltage applied to the anode 10, so that the energy level of the hole transport layer 20 is raised and the injection barrier of the hole transport layer 20 is increased to reduce the number of the holes injected into the light emitting layer 30.

Based on the above, in the case in which the number of the holes injected into the light emitting layer 30 is smaller than the number of the electrons injected into the light emitting layer 30, in order to reduce a power consumption of the light emitting diode, in the embodiments of the present disclosure, the light emitting diode includes the first auxiliary electrode 60 and the first insulating layer 70 optionally. The control chip has a third voltage port but does not have the fourth voltage port, and the third voltage port is electrically connected to the first auxiliary electrode 60. Similarly, in the case in which the number of the electrons injected into the light emitting layer 30 is smaller than the number of the holes injected into the light emitting layer 30, in order to reduce the power consumption of the light emitting diode, in the embodiments of the present disclosure, the light emitting diode includes the second auxiliary electrode 90 and the second insulating layer 80 optionally. The control chip has a sixth voltage port but does not have the fifth voltage port, and the sixth voltage port is electrically connected to the second auxiliary electrode 90.

The foregoing descriptions are merely specific implementation manners of the present disclosure, but the protection scope of the present disclosure is not limited thereto. Any person skilled in the art may easily think of the change or the replacement within the technical scope disclosed in the present disclosure, which should be within the scope of the disclosure. Therefore, the protection scope of the present disclosure should be based on the protection scope of the claims.

What is claimed is:

1. A light emitting diode, comprising:
   an anode, a hole transport layer, a light emitting layer, an electron transport layer and a cathode, which are sequentially disposed; and
   a first auxiliary electrode and a first insulating layer which are disposed on a side of the anode away from the hole transport layer, wherein the first insulating layer is located between the first auxiliary electrode and the anode, and the first auxiliary electrode is electrically insulated from the anode through the first insulating layer;
   and/or a second insulating layer and a second auxiliary electrode which are disposed on a side of the cathode away from the electron transport layer, wherein the second insulating layer is located between the second auxiliary electrode and the cathode, and the second auxiliary electrode is electrically insulated from the cathode through the second insulating layer.

2. The light emitting diode according to claim 1, wherein the anode and/or the cathode have/has a mesh structure or a porous structure.

3. The light emitting diode according to claim 1, wherein the light emitting diode further comprises a hole injection layer disposed between the anode and the hole transport layer, and/or an electron injection layer disposed between the cathode and the electron transport layer.

4. The light emitting diode according to claim 3, wherein in a case in which the light emitting diode further comprises the hole injection layer and the electron injection layer, each of thicknesses of the hole transport layer, the hole injection layer, the electron injection layer and the electron transport layer ranges from 1 nm to 200 nm.

5. The light emitting diode according to claim 1, wherein a material of the light emitting layer comprises a quantum dot light emitting material or an organic electroluminescent material.

6. An array substrate, comprising a plurality of light emitting diodes according to claim 1 arranged in a matrix.

7. The array substrate according to claim 6, wherein in a case in which an anode has a porous structure, a size of an aperture of the porous structure is in an order of microns or nanometers, and the size of the aperture is smaller than a size of one sub-pixel of the array substrate.

8. A light emitting device, comprising an array substrate according to claim 6 and a control chip, wherein the control chip has a first voltage port and a second voltage port, an anode of a light emitting diode of the array substrate is electrically connected to the first voltage port, and a cathode of the light emitting diode of the array substrate is electrically connected to the second voltage port; and
   in a case in which a number of holes injected into a light emitting layer is smaller than a number of electrons injected into the light emitting layer, the control chip further has a third voltage port and/or a fourth voltage port, wherein the third voltage port is electrically connected to a first auxiliary electrode, and the fourth voltage port is electrically connected to a second auxiliary electrode, wherein a voltage of the third voltage port is smaller a voltage of the first voltage port, and a voltage of the fourth voltage port is smaller than a voltage of the second voltage port; or
   in a case in which the number of the electrons injected into the light emitting layer is smaller than the number of the holes injected into the light emitting layer, the control chip further has a fifth voltage port and/or a sixth voltage port, wherein the fifth voltage port is electrically connected to the first auxiliary electrode, and the sixth voltage port is electrically connected to the second auxiliary electrode, wherein a voltage of the fifth voltage port is greater than the voltage of the first voltage port, and a voltage of the sixth voltage port is greater than the voltage of the second voltage port.

9. A display device, comprising an array substrate according to claim 6 and a control chip, wherein the control chip has a first voltage port and a second voltage port, an anode of a light emitting diode of the array substrate is electrically connected to the first voltage port, and a cathode of the light emitting diode is electrically connected to the second voltage port; and
   in a case in which a number of holes injected into a light emitting layer is smaller than a number of electrons injected into the light emitting layer, the control chip further has a third voltage port and/or a fourth voltage port, wherein the third voltage port is electrically connected to a first auxiliary electrode, and the fourth voltage port is electrically connected to a second auxiliary electrode, wherein a voltage of the third voltage port is smaller than a voltage of the first voltage port, and a voltage of the fourth voltage port is smaller than a voltage of the second voltage port; or
   in a case in which the number of the electrons injected into the light emitting layer is smaller than the number of the holes injected into the light emitting layer, the control chip further has a fifth voltage port and/or a sixth voltage port, wherein the fifth voltage port is electrically connected to the first auxiliary electrode, and the sixth voltage port is electrically connected to the second auxiliary electrode, wherein a voltage of the fifth voltage port is greater than the voltage of the first voltage port, and a voltage of the sixth voltage port is greater than the voltage of the second voltage port.

10. The array substrate according to claim 6, wherein the array substrate further comprises a thin film transistor, the thin film transistor comprises a source, an active layer, a drain, a gate, a gate insulating layer, and the drain is electrically connected to a cathode of the light emitting diode or an anode of the light emitting diode, the gate is located at a same layer with a first auxiliary electrode of the light emitting diode or a pattern of the gate is same to a pattern of the first auxiliary electrode of the light emitting diode.

11. The array substrate according to claim 10, wherein the gate insulating layer and the first insulating layer are formed simultaneously.

12. The array substrate according to claim 6, wherein the array substrate further comprises a thin film transistor, the thin film transistor comprises a source, an active layer, a drain, a gate, a gate insulating layer, and the drain is electrically connected to a cathode of the light emitting diode or an anode of the light emitting diode, the gate is located at a same layer with a second auxiliary electrode of the light emitting diode; or a pattern of the gate is same to a pattern of the second auxiliary electrode of the light emitting diode.

13. The array substrate according to claim 12, wherein the gate insulating layer and the second insulating layer are formed simultaneously.

14. The array substrate according to claim 6, wherein first auxiliary electrodes of the plurality of light emitting diodes are connected to each other to form a whole electrode.

15. The array substrate according to claim 14, wherein first insulating layers of the plurality of light emitting diodes are connected to each other to form a whole insulating layer.

16. The array substrate according to claim 6, wherein second auxiliary electrodes of the plurality of light emitting diodes are connected to each other to form a whole electrode.

17. The array substrate according to claim 16, wherein second insulating layers of the plurality of light emitting diodes are connected to each other to form a whole insulating layer.

* * * * *

UNITED STATES PATENT AND TRADEMARK OFFICE
CERTIFICATE OF CORRECTION

PATENT NO. : 10,476,021 B2  
APPLICATION NO. : 15/772504  
DATED : November 12, 2019  
INVENTOR(S) : Wei Xu et al.

Page 1 of 1

It is certified that error appears in the above-identified patent and that said Letters Patent is hereby corrected as shown below:

On the Title Page

Column 1, on the line after:
"(65) Prior Publication Data
US 2019/0081260 A1 Mar. 14, 2019", insert
-- (30) Foreign Application Priority Data
Mar. 8, 2017 (CN).....................201710135932 --

Signed and Sealed this
Twenty-first Day of May, 2024

Katherine Kelly Vidal
*Director of the United States Patent and Trademark Office*